United States Patent [19]

Maley

[11] 4,334,310

[45] Jun. 8, 1982

[54] NOISE SUPPRESSING BILEVEL DATA SIGNAL DRIVER CIRCUIT ARRANGEMENT

[75] Inventor: Gerald A. Maley, Fishkill, N.Y.

[73] Assignee: International Business Machines Corporation, Armonk, N.Y.

[21] Appl. No.: 162,344

[22] Filed: Jun. 23, 1980

[51] Int. Cl.³ .............................................. H02J 1/04
[52] U.S. Cl. ...................................... 371/64; 307/34; 307/39; 365/206
[58] Field of Search ...................... 371/64, 49; 365/206; 307/33, 34, 39, 270

[56] References Cited

U.S. PATENT DOCUMENTS

| | | | |
|---|---|---|---|
| 3,010,027 | 11/1961 | Gaunt, Jr. | 365/242 |
| 3,213,433 | 10/1965 | Tribby | 307/412 |
| 3,243,787 | 3/1966 | Habib | 365/154 |
| 3,467,953 | 9/1969 | Harding | 365/206 |
| 3,643,239 | 2/1972 | Mack et al. | 365/206 |
| 3,678,259 | 7/1972 | Kyser | 364/715 |
| 4,068,148 | 1/1978 | Nomiya et al. | 307/33 X |

Primary Examiner—David H. Malzahn
Attorney, Agent, or Firm—George E. Roush

[57] ABSTRACT

The generation of internal circuit noise due to the switching of differing numbers of bilevel data lines is suppressed by maintaining the energizing current substantially constant with widely varying amounts of current drawn by varying the current drawn by redundant driver circuits, which also generate parity or check signals, to compensate for the difference in current drawn by the designated data driver circuits. The number of redundant driver circuits is reduced by loading the second and further redundant driver circuits for drawing currewnts related to the current drawn by the first redundant driver circuit by succeeding powers of two. Further suppression in internal circuit noise obtains with gating of all driver circuits at the time switching occurs. Control circuitry comprising conventional full adder circuits arranged for expressing the number of data signal lines in a given level is advantageous for controlling the redundant driver circuits and for generating check bits at the same time.

10 Claims, 4 Drawing Figures

NOISE SUPPRESSING BILEVEL DATA SIGNAL DRIVER CIRCUIT ARRANGEMENT

FIELD OF THE INVENTION

The invention relates to switched bilevel data signal translating circuitry, and it particularly pertains to data driver circuitry arranged for suppressing the generation of internal circuit noise normally generated in an electronic switching environment.

BACKGROUND

The generation of internal circuit noise in switching type information handling circuits has long been recognized as a major problem. There are many sources of noise internally generated in information signal handling circuitry. Most of those skilled-in-the-art accept the principal reason as inadequate power supply decoupling at some level in the overall circuitry. Be that as it may, the problem still exists in many aspects, not the least of which is the distributed effect of switching transients generated at some stage of the overall circuitry. Many solutions have been offered, and many have been promising. But there still is room for improvement.

SUMMARY

In accordance with the invention, the generation of internal circuit noise due to the switching of bilevel data signals is suppressed in driver circuitry having a multiple of data driver circuits and a plurality of redundant auxiliary driver circuits energized by way of a common electric lead to a common source of energizing potential. The data driver circuits are actuated by given levels of a multi-element bistatic or bilevel signal on the individual signal input lines. For a character in a given coding system, 0-m lines are switched to a given signal level. The amount of current drawn from the common source varies, of course, with the number of lines switched to the given level. The deleterious effects of such switching are obviated in a driver circuit, according to the invention, having one or more redundant driver circuits arranged to draw current from said source in amounts whereby the current flow from said source is substantially constant at all times; the potential of the source and the power drawn therefrom is thereby also substantially constant for all intents and purposes whereby no internal noise of any consequence should arise.

According to the invention, the redundant driver circuitry also generates error checking and correcting codes for ensuring the proper translation of data signals.

Further, in accordance with the invention, the number of redundant driver circuits employed is considerably less than the number of possible data signal drivers idle for a given signal. This is accomplished by arranging the first redundant driver circuit to draw the same unit amount of current that each of the data drivers draw when a given level of signal is applied, and arranging the further redundant drivers to draw current related to the unit current by succeeding powers of two.

Simultaneously gating the driver circuits at switching time also serves to reduce any tendency for internal circuit noise to be enhanced in the component driver circuits themselves.

Simple binary control circuitry is arranged for gating the redundant driver circuits in the proper number at the proper time.

It is a decided advantage of the circuit arrangement of the invention that it is readily assembled in multiple-semiconductor-chip form and the current is held constant internally of the several chips.

PRIOR ART

The applicant is aware of prior art having some component circuitry in common with circuitry according to the invention as shown in these U.S. Pat. Nos:

| | | | |
|---|---|---|---|
| 3,010,027 | 11/1961 | Gaunt | 307/39 |
| 3,213,433 | 10/1965 | Tribby | 340/174 |
| 3,243,787 | 3/1966 | Habib | 340/174 |
| 3,467,953 | 9/1969 | Harding | 340/174 |
| 3,643,239 | 2/1972 | Mack et al | 340/174 DC |

The patent to Gaunt is directed to circuitry for maintaining the current applied to a varying number of current drawing devices constant as the devices are switched into and out of circuit with the source of the current by the use of a controllable compensating series impedance element and a transformer arranged for presenting the compensating impedance in opposition to the load impedance.

The patent to Tribby is directed to circuitry for maintaining current constant for a varying number of current consuming devices by switching the total current through the devices or through a sink resident in the switching circuit for drawing the same current from the source.

The patent to Habib is directed to a circuit arrangement where each one of a number of electric devices is matched by another substantially identical but dummy device whereby the energizing current is substantially constant.

Harding, in his patent, teaches a system wherein noise is not prevented from arising, but is detected and neutralized by circuitry which inverts the noise and thereafter cancels it at a point in the system. The drive current of a current source is adjusted per circuit in accordance with the noise in that circuit.

The patent to Mack et al. teaches a concept of dividing the components into predetermined groups with the components in group cooperating to reduce noise by transposing lines and thereby neutralizing the noise component of the signal.

While these patents have a feature or two in common with the instant invention, it is clear upon inspection that each lacks the concepts and the means for embodying them for forming a circuit arrangement that suppresses the generation of noise at the outset by maintaining the energizing current, and thereby the potential and power also, substantially constant despite wide variation in total current drawn by a greatly varying number of data driver circuits by switching a small number of redundant driver circuits and simultaneously generating error checking and correcting signals.

DRAWING

In order that the advantages of the invention obtain in practice, the best mode embodiment thereof, given by way of example only, is described in detail hereinafter with reference to the accompanying drawing, forming a part of the specification, and in which.

DESCRIPTION

Figure 1:
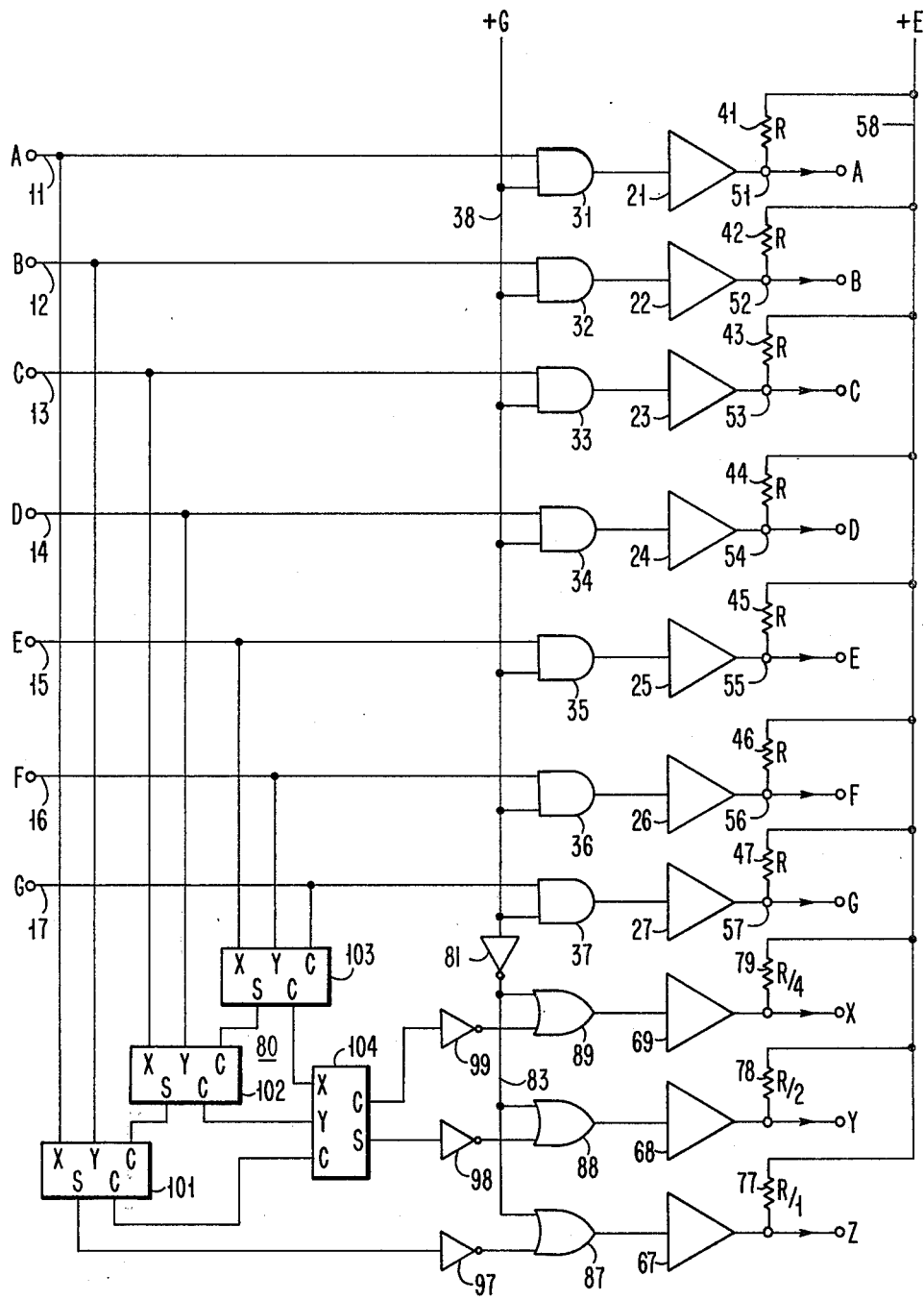
FIG. 1 is a schematic diagram of an embodiment of driver circuitry according to the invention.

A schematic diagram of one embodiment of a bilevel signal data driver circuit arrangement according to the invention is given in FIG. 1. A bilevel signal translated by switching techniques is presented on each of a multiple of signal input lines 11, 12 . . . 17 for application to driver circuits 21, 22 . . . 27 preferably by way of individual AND gating circuits 31, 32 . . . 37 all connected to a common gating signal line 38. The driver circuits 21-27 as shown are "open collector" circuits. An example of an "open collector" circuit suitable, among many others, in the practice of the invention is shown in FIG. 2.

An input terminal 60 is connected to the base electrode of an input transistor 61 having an emitter electrode connected to the base electrode of an output transistor 62 connected in turn to an output terminal 63. A biasing resistor 64 is arranged for biasing the input transistor 61. An emitter lead resistor 65 develops potential between the emitter of the initial transistor 61 and ground to which the emitter electrode of the output transistor 62 is connected. A load resistor 66 completes the circuit of the input transistor 61 and a speed-up capacitor 67 is coupled between the collector electrodes of the input and output transistors. The collector electrode of the output transistor 62 as shown is left "open". That is, the collector electrode is brought directly to the output terminal 63 and no load resistor is provided internally of the driver circuit. This is done in order that the circuit designer may choose the value of the load resistor or even choose the characteristic of the load device, for example a relay energizing solenoid. Here the load is a resistor 71 connected to the input terminal 72 of the subsequent circuit and to the output terminal 63 of the driver circuit. In this manner the transistor 62 is energized and the output developed by way of the load resistor 71.

Figure 2:
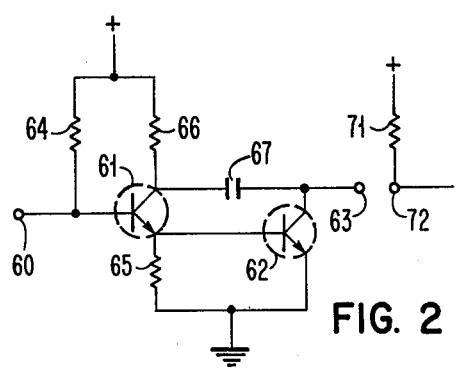
FIG. 2 is a schematic diagram of an exemplary driver circuit applicable to the circuit arrangement according to the invention.

Referring again to FIG. 1, load resistors 41, 42 . . . 47 are individually connected to output terminals 51, 52 . . . 57 of the driver circuits 21-27 completing the circuit essentially as shown in FIG. 2. All of the load resistors are of substantially the same value and are connected to a common energizing potential line 58.

The bilevel signal as it appears at any one instant on signal input lines 11-17 may comprise individual levels drawing seven, six . . . one or zero units of current from the energizing potential source over line 58. This wide variation in current drawn tends to generate internal circuit noise, reflecting inadequate power supply decoupling for one example of cause for this undesirable effect.

In accordance with the invention, the internal circuit noise from this source is suppressed by the addition of redundant driver circuits 67, 68 and 69 preferably identical to the data driver circuits. The number of such redundant driver circuits needed for a given application is less than the number of data driver circuits by arranging the values of the load resistor in accordance with the invention. Load resistor 77 is given a value equal to the values of each of the data driver circuit load resistors 41, 42 . . . 47, whereby turning on the redundant driver circuit 67 will cause one unit of current to be drawn by this load. The load resistor 78 is given a value of one half that of the data driver circuit load resistors whereby two units of current are drawn. The following load resistor 79 is given a value one fourth of that of the data circuit load resistors whereby four units of current are drawn. For more than seven data driver circuits the succeeding redundant circuit load resistor value is reduced by the next binary order, eight, and so on. Table I below gives the number N of redundant driver circuits for the number M of data driver circuits in place.

TABLE I

| L | M Lines | N Drivers |
|---|---------|-----------|
| 1 | 2-3     | 2         |
| 2 | 4-7     | 3         |
| 3 | 8-15    | 4         |
| 4 | 16-31   | 5         |
| . . . | | |

For seven input data driver and three redundant driver circuits as shown in FIG. 1, a seven element signal of 128 different characters, the selected driver circuits will always draw seven units of current as can be seen by inspecting the (partial) Table II below for an alphabet of seven element characters.

TABLE II

| L | M | | | | | | | N | | |
|---|---|---|---|---|---|---|---|---|---|---|
|   | A | B | C | D | E | F | G | 1 | 2 | 4 |
| 0 | φ | φ | φ | φ | φ | φ | φ | 1 | 1 | 1 |
| 1 | φ | φ | φ | φ | φ | φ | 1 | φ | 1 | 1 |
| 2 | φ | φ | φ | φ | φ | 1 | φ | φ | 1 | 1 |
| 3 | φ | φ | φ | φ | φ | 1 | 1 | 1 | φ | 1 |
| 4 | φ | φ | φ | φ | 1 | φ | φ | φ | 1 | 1 |
| . . . | | | | | | | | | | |
| 7 | φ | φ | φ | φ | 1 | 1 | 1 | φ | φ | 1 |
| 8 | φ | φ | φ | 1 | φ | φ | φ | φ | 1 | 1 |
| . . . | | | | | | | | | | |
| 31 | φ | φ | 1 | 1 | 1 | 1 | 1 | φ | 1 | φ |
| . . . | | | | | | | | | | |
| 63 | φ | 1 | 1 | 1 | 1 | 1 | 1 | 1 | φ | φ |
| . . . | | | | | | | | | | |
| 127 | 1 | 1 | 1 | 1 | 1 | 1 | 1 | φ | φ | φ |

The redundant driver circuits 67, 68, 69 are selected by means of a control circuit 80. The gating line 38 is connected to an inverting circuit 81 having an inverted gating output line 83 connected in common to OR gating circuits 87, 88, 89 which are individually connected to the redundant driver circuits. Another input lead of each of the OR gating circuits 87-89 is connected individually to further inverting circuits 97, 98, 99. Four full adder circuits 101, 102, 103, 104 complete the control circuit arrangement.

Figure 3:
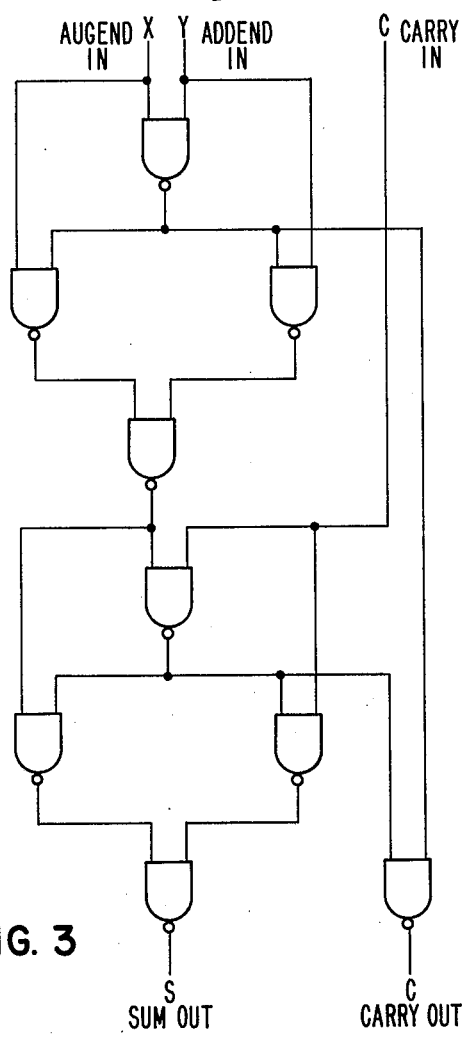
FIG. 3 is a logical diagram of a full adder circuit useful in the practice of the invention.

The adder circuits are conventional binary adder circuits and preferably are of the type shown in FIG. 3. All of the logical circuit symbols are NAND gating circuits as described in greater detail in the "Manual of Logic Design" by Gerald Maley, published by Prentice-Hall in 1970, page 66. The succession adder circuits 101, 102, 103 are connected as shown with the avgenol and addend inputs individually connected to the input data lines. If there is an odd number of data lines, the last line is connected to the carry input terminal of the last adder 103 of the succession of adder circuits, otherwise this carry input terminal is connected to accept no carry input value (or connected for a constant zero carry). The sum output terminals of the adder circuits 103 and 102 are connected to the carry input terminals of the preceding adder circuits. The carry output terminals of the three adder circuits 101, 102 and 103 are connected to the three inputs of the further adder circuit 104. The sum output of the adder circuit 101 and the sum and carry outputs of the further adder circuit 104 are individually connected to the input terminals of the inverter circuits 97, 98 and 99 respectively. The adder circuits 103, 102 and 101 sum in ascending binary orders whereby the corresponding redundant driver circuit draws the current required to balance the overall load.

The redundant driving circuits perform another useful function according to the invention. The binary number of units of current drawn is related to the number of data driver circuits at a given signal level in that the number is equal to the number of data driver circuits at the level opposite to the given level as is readily seen by inspection of Table II. For example, line 3 indicates that data input lines FG are at the binary one (1) level drawing a total of 2 units of current, and redundant driver circuits "1" and "4" are drawing currents of 1 and 4 units respectively. Thus, out of the maximum total number, 7, of units of current, the data drivers are drawing 2 units and the redundant drivers are drawing 5 units of current. Only two "extra" redundant driver circuits are required, in effect, since one parity check circuit is normally required anyway. The binary number available on redundant output lines x, y and z is therefore useable for error checking and like purposes. For example, circuitry similar to the driver circuit arrangement is arranged at a distant terminal for regenerating the x, y and z values and these values are compared in simple comparator circuitry with the x, y and z bits that arrive with the data. The techniques relative to the Hamming Alphabet are applicable.

Figure 4:
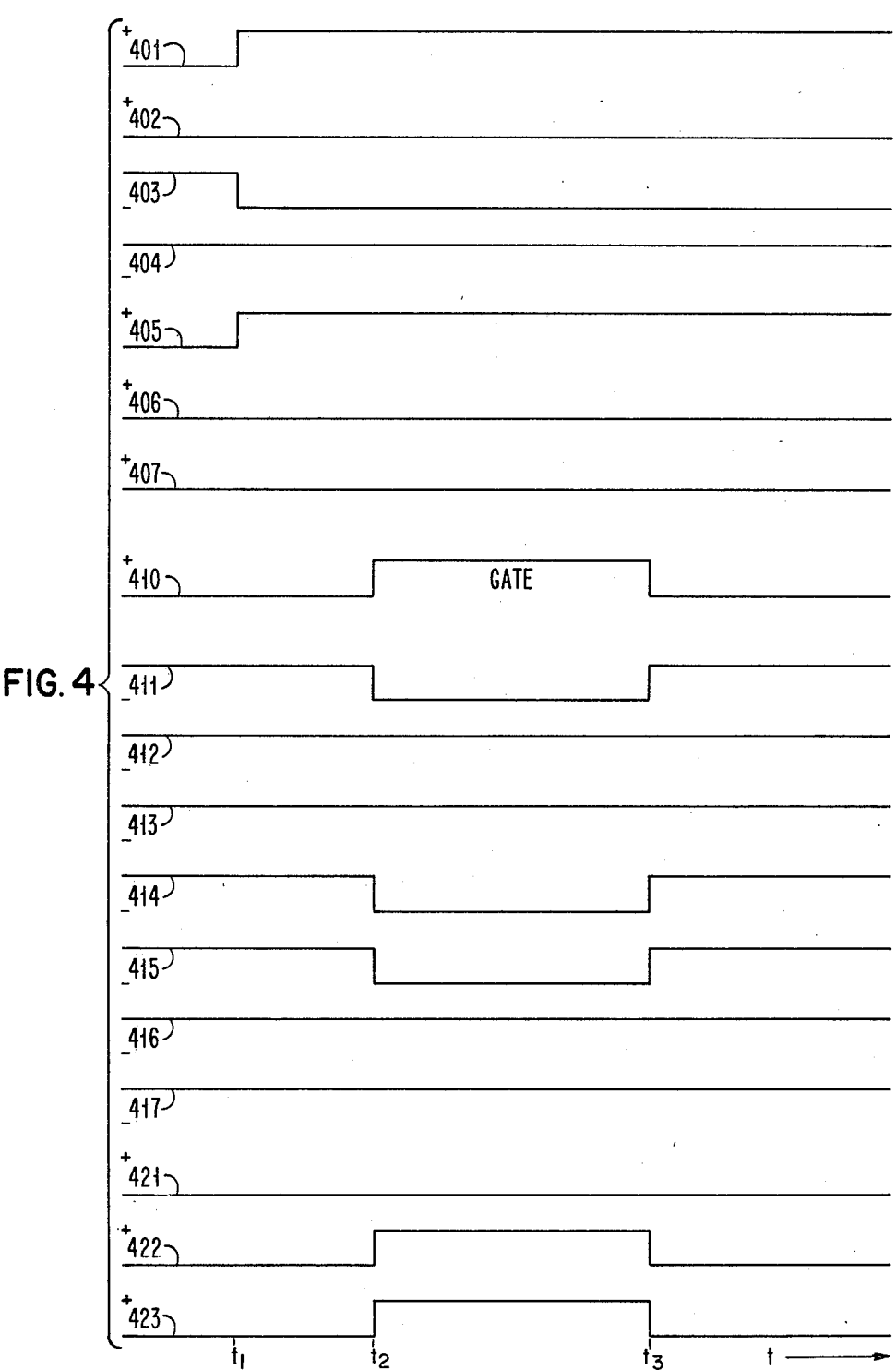
FIG. 4 is a graphical representation of waveforms useful in an understanding of the invention.

FIG. 4 is a graphical representation of waveforms at pertinent points of the circuit arrangement according to the invention that will aid in understanding of the operation. Curves 401, 402 . . . 407 represent an example of data on lines 11, 12 . . . 17 (FIG. 1). The initial data as shown is 1, $\phi$, $\phi$, 1, 1, $\phi$, $\phi$ at time $t_0$, which changes at time $t_1$ will result in data $\phi$, 1, 1, $\phi$, $\phi$, 1, 1 shown in curves 411, 412 . . . 417, as will be determined when the gate level represented by the curve 410 is raised. The x, y, z data is $\phi$, 1, 1 as shown by curves 421, 422 and 423 after time $t_2$ and before time $t_3$, at which time the gate level is dropped.

Thus, the current drawing redundant driver circuits are fewer in number than the data driver circuits which they balance and the relative number is even less as the number of elements per character is increased; the upper limit is set by the fact that the current drawn by the next redundant driver circuit is doubled for each additional redundant circuit. The control circuitry merely expands arithmetically and thus remains extremely simple for any number of character elements.

While the invention has been described in terms of an express embodiment, and alternatives have been suggested, it is clearly to be understood that those skilled in the art will effect further changes without departing from the spirit and scope of the invention as defined in the appended claims.

The invention claimed is:

1. A noise suppressing bilevel data signal driver circuit arrangement comprising
   a multiple of signal input lines,
   a multiple of data driver circuits having input terminals individually coupled to said signal input lines and output terminals at which data is delivered for utilization in subsequent circuitry,
   a plurality of auxiliary driver circuits having input terminals and output terminals (at which auxiliary information is available),
   a common energizing potential source connected to all of said driver circuits, and
   control circuitry having input terminals individually connected to said input signal lines and output terminals individually coupled to said input terminals of said auxiliary driver circuits and arranged for sensing the number of said data driver circuits coupled to signal input lines at a given level and turning on a predetermined number of said auxiliary driver circuits related to the number of data driver circuits remaining at a level other than said given level for maintaining the current drawn from said energizing potential source constant for any number of said data driver circuits at said given level.

2. A bilevel data signal driver circuit arrangement as defined in claim 1, and incorporating
   utilization circuitry, and wherein said output terminals of said auxiliary driver circuits are connected to said utilization circuitry.

3. A bilevel data signal driver circuit arrangement as defined in claim 2, and wherein
   said auxiliary information comprises parity check data.

4. A bilevel data signal driver circuit arrangement as defined in claim 1, and wherein
   each of said data driver circuits draws one unit of current at said given signal level,
   one of said auxiliary driver circuits draws said one unit of current, and
   the remaining auxiliary driver circuits each draws differing amounts of current related to said one unit of current by succeeding powers of two.

5. A bilevel data signal driver circuit arrangement as defined in claim 4, and wherein
   each of said data driver and said one auxiliary driver circuits are connected to a load resistor of predetermined value, and
   said remaining auxiliary driver circuits are connected to load resistors of diminishing values related by the reciprocals of succeeding powers of two.

6. A bilevel data signal driver circuit arrangement as defined in claim 1, and incorporating
   a gating control line, multiple of dual input gating circuits individually interposed between said signal input lines and said driver circuits, with one input of each gating circuit connected in common to said gating control line.

7. A bilevel data signal driver circuit arrangement as defined in claim 1, and wherein
   said control circuitry comprises a multiple of adder circuits.

8. A noise suppressing bilevel data signal driver circuit arrangement comprising
a multiple of data driving circuits each comprising
an input data line,
a common gating line,
a dual input AND gating circuit having one input lead connected to said input data line, having the other input lead connected to said common gating line and having an output lead, and
a driver circuit having an input terminal connected to said output lead of said AND gating circuit, and an output terminal connected to a load resistor of given value which is connected to a common energizing potential source,
a plurality of auxiliary driving circuits each comprising
a dual input OR gating circuit having one input lead connected to the output terminal of an inverting circuit having an input terminal and having the other input lead connected in common to the output terminal of a common inverter circuit of which the input terminal is connected to said common line, and
a driver circuit having an input terminal connected to the output terminal of said OR gating circuit, and an output terminal connected to a load resistor which is connected to said common energizing potential source, one of said load resistors having a value equal to said given value and the remaining load resistors having diminishing values related by the reciprocals of succeeding powers of two,
a multiple of adder circuits each having two addend and carry input terminals and sum and carry output terminals,
said input data lines being individually connected to addend input terminals of a first adder circuit of a succession of said adder circuits with the carry input terminals of the first of said adder circuits free in the event of mismatch in numbers of lines and numbers of addend input terminals of said adder circuits, the sum output terminals of each adder circuit being connected to the carry input terminal of the succeeding adder circuit in the succession, the sum output terminal of the last adder circuit of the succession being connected to said input terminals of one of said inverting circuits, and carry output terminals of each of said adder circuits in the succession being individually connected to the input terminals of further adder circuitry, and the output terminals of said further adder circuitry being individually connected to said input terminals of the remaining inverter circuits.

9. A bilevel data signal driver circuit arrangement as defined in claim 8, and wherein
said succession of adder circuits comprises three adder circuits, and
said further adder circuitry comprises a single adder circuit.

10. A bilevel noise suppressing pulsed current driving circuit comprising
a plurality of pulsed data control lines,
a plurality of pulsed data drivers connected to receive respective ones of said control lines,
a plurality of pulsed non-data drivers,
a source of energizing potential connected to said drivers,
each said data driver providing the same pulsed current value when representing a respective binary one,
said non-data drivers providing pulsed current values which are related to each other by powers of two, the value of said data driver current representing binary one equaling the lowest finite value of said non-data driver currents,
encoding means connected to said control lines and operative to generate signals representing in binary notation the number of said data control lines which are not pulsed at a given time, and
means for applying said signals to said pulsed non-data drivers.

* * * * *